United States Patent [19]

Marion et al.

[11] Patent Number: 5,119,240
[45] Date of Patent: Jun. 2, 1992

[54] ASSEMBLY OF PARTS FORMING AN ANGLE BETWEEN THEM AND PROCESS FOR OBTAINING SAID ASSEMBLY

[75] Inventors: Francois Marion, Saint Egreve; Michel Ravetto, Seyssinet; Jean-Luc Tissot, Saint Egreve, all of France

[73] Assignee: Commissariat a l'Energie Atomique, France

[21] Appl. No.: 564,732

[22] Filed: Aug. 8, 1990

[30] Foreign Application Priority Data

Aug. 18, 1989 [FR] France ................... 89 11014

[51] Int. Cl.$^5$ .............................................. B23K 1/00
[52] U.S. Cl. .................................. 359/850; 228/121; 228/123; 228/254; 250/393; 359/855; 359/871; 403/272
[58] Field of Search ............. 228/123, 180.2, 121, 228/254; 437/129, 209; 357/30; 403/272; 361/420; 359/838, 850, 855, 871; 250/393

[56] References Cited

U.S. PATENT DOCUMENTS

| | | | |
|---|---|---|---|
| 3,458,925 | 8/1969 | Napier et al. | 228/180.2 |
| 4,289,380 | 9/1981 | Tucker | 359/855 X |
| 4,352,449 | 10/1982 | Hall et al. | 228/123 |
| 4,623,955 | 11/1986 | Sartini | 359/855 X |
| 4,817,849 | 4/1989 | Yamamoto et al. | 228/123 X |

FOREIGN PATENT DOCUMENTS 2653650 5/1978 Fed. Rep. of Germany.
87/01509 3/1987 PCT Int'l Appl..
2136145 11/1983 United Kingdom.

Primary Examiner—Kenneth J. Ramsey
Attorney, Agent, or Firm—Hayes, Soloway, Hennessey & Hage

[57] ABSTRACT

An assembly of parts forming an angle between facing surfaces of the parts and a process for producing an assembly is described. The parts (2, 4) are provided with contact elements or pads (6, 8, 10, 12) for connection to one another by means of a relatively low melting point metallic soldering material. The surface of each of the pads is wettable by the low melting point metallic material in the molten state, while areas surrounding the pads are not wettable. The contact pads of one of the parts are covered with flat coils or wafers (10, 12) of the low melting point metallic material. The wafers have the same thickness, but different volumes. The contact pads of the other part are placed on the corresponding wafers. The wafers' thickness, volumes, and spacing are chosen so that when the wafers are heated to the molten state and form truncated spherical drops due to surface tension, the parts form between them a predetermined angle. The invention has particular application to the manufacture of mirrors.

9 Claims, 4 Drawing Sheets

ASSEMBLY OF PARTS FORMING AN ANGLE BETWEEN THEM AND PROCESS FOR OBTAINING SAID ASSEMBLY

FIELD OF THE INVENTION

The present invention relates to an assembly of parts forming an angle between them, as well as to a process for obtaining this assembly. It more particularly applies to the assembly of very small, lightweight, planar parts, which must form between them a small angle which is determined beforehand, when there is to be a high positioning accuracy of the parts and the assembly has to be insensitive to vibrations.

Thus, the invention is e.g. applicable to the manufacture of a mirror resulting from the assembly of a large number of small planar plates which, with a substrate, form predetermined angles in order to obtain the said mirror.

BACKGROUND OF THE INVENTION

Methods are already known which make it possible to obtain an assembly of parts forming an angle between them. These methods include fixing by nut and screw, which makes it possible to regulate the angle formed by two parts which it is wished to assemble, but the assembly is cumbersome. Besides the two parts, it requires numerous other parts increasing the weight of the assembly. In addition, said assembly can suffer from regulating losses (variation of the angle between the parts), due to the mechanical vibrations to which such an assembly is normally exposed during use or storage. Finally, this known method is limited to parts with relatively large dimensions. Another method is bonding or adhesion with a shim, which is interposed between the two parts. Such an arrangement requires the production of shims in the form of wedges with very small dimensions and which are therefore very fragile. This is followed by the adhesion of the assembly between the shims and the parts, which leads to problems in connection with the positioning at the time of adhesion and to the displacement of one part relative to the other as a result of the drying or polymerization of the adhesive.

A process for the assembly of electronic components by means of soldering elements is also known more particularly from PCT/GB86/00538 (WO87/01509). However, this known process leads to an assembly in which the faces of the electronic components, when they face one another, are parallel.

SUMMARY OF THE INVENTION

The present invention is directed at an assembly of parts forming an angle between them, as well as to a process for obtaining said assembly, the latter not having the disadvantages of large overall dimensions, weight, sensitivity vibrations and relative displacement of the parts inherent in the aforementioned methods.

More specifically, the present invention firstly relates to an assembly of a first part and at least one second part, whereof one face faces a face of the first part and forms an angle therewith, characterized in that the face of the first part comprises at least two contact pads, in that the face of the second part comprises contact studs respectively facing those of the first part, in that the assembly also comprises at least two soldering elements essentially shaped like a truncated sphere, which respectively connect the contact pads of the first part to the corresponding contact pads of the second part, one of the elements having a volume larger than that of the other element and in that the surfaces of the contact pads are wettable by the material of the soldering elements in the molten state, whereas their environment is not.

According to a particular embodiment of the assembly according to the invention, it comprises at least one row of soldering elements, whose volumes increase from one end of the row to the other, each element connecting a contact stud of the first part to a contact pad of the second part.

According to another embodiment, the assembly comprises a plurality of parallel rows of soldering elements and, in each row, the soldering elements have the same volume, said volume increasing from one end row to the other end row.

In an application of the present invention, the first part is mobile in translation relative to a support provided with a light source and a detector of said light and the second part is able to reflect said light by its other face and is positioned facing the light source and turned towards the detector, so as to reflect the light towards the same for a given position of the first part with respect to the support.

In another application, the assembly comprises a plurality of second parts, whereof the other faces are optically reflecting and which are fixed to the first part by soldering elements in such a way that the other faces of the second part form a mirror.

In a second application, the first part also carries an integrated optical device and the second part has a light emitter for transmitting a light beam in the direction of the integrated optical device.

The present invention also relates to a process for the assembly of a first part and at least one second part, whereof one face faces a face of the first part and carries contact pads for connection respectively to contact pads carried by the face of the first part by means of soldering elements made from a metallic material with a low soldering point and solderable to the contact pads, the surface of each contact pad being wettable by the material in the molten state, whereas its environment is not, characterized in that it comprises the stages of each contact pad of the first part being covered with a wafer of the material, which extends over the environment of said contact pad, the wafers having a substantially constant thickness, the contact pads of the second part are placed on the corresponding wafers of the first part, the wafers are raised to a temperature at which they are in the molten state, said wafers having different volumes which, like the thickness of the wafers, the values of the surfaces of the contact pads and the spacing between the contact pads, are chosen in such a way that the face of the second part forms a predetermined angle with the face of the first part when the wafers are heated to said temperature and the temperature is lowered below the melting point of the material.

In a special embodiment of the process according to the invention, the first part comprises at least one row of contact pads and on said pads are formed wafers, whose volumes increase from one end of the row to the other and make it possible to obtain said angle.

Finally, in another embodiment, the first part comprises a plurality of parallel lines or rows of contact pads and, for each row, on the contact pads of said row are formed wafers of the same volume, the volumes of said wafers increasing from one end row to the other and making it possible to obtain the said angle.

BRIEF DESCRIPTION OF THE DRAWINGS

The invention is described in greater detail hereinafter relative to non-limitative embodiments and the attached drawings, wherein show.

DETAILED DESCRIPTION OF THE PREFERRED EMBODIMENTS OF THE INVENTION

Figure 1:
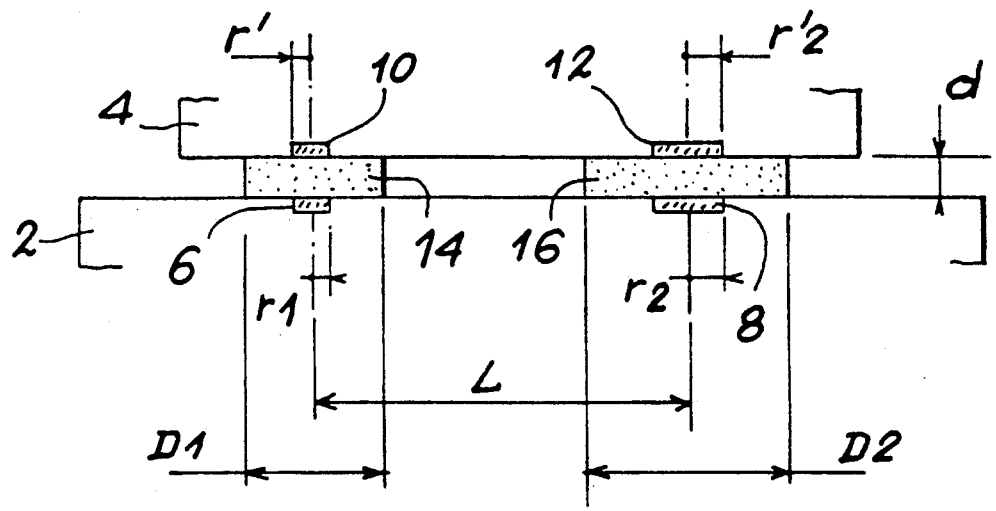
FIGS. 1A and 1B: Diagrammatically a process according to the invention permitting the assembly of two parts by means of two soldering elements, FIG. 1A showing the two parts prior to their assembly and FIG. 1B the assembly obtained.
Figure 1:
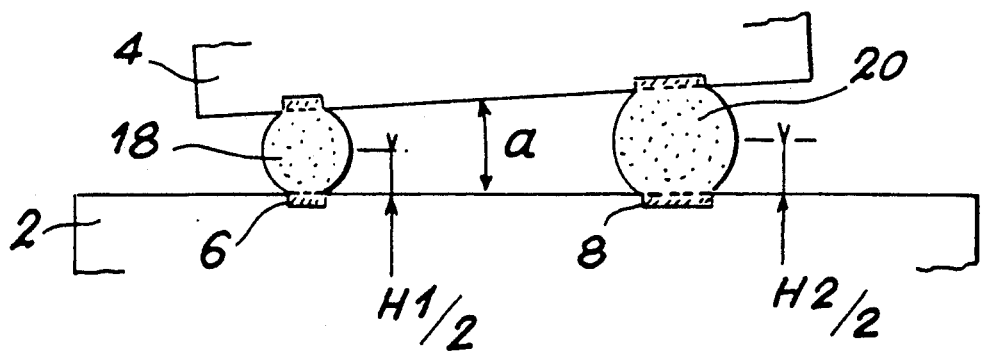

The present invention makes use of soldering elements or members formed from a material, whose melting point is sufficiently low that it does not lead to any deterioration of the parts during their assembly in accordance with the invention. The material can be chosen from the group including tin, indium, lead and metal alloys with a low melting point containing tin, indium or lead.

FIGS. 1A and 1B diagrammatically illustrate a process according to the invention making it possible to assemble two parts 2 and 4. These are e.g. plates formed from a semiconductor material such as silicon. The part 2 carries contact pads or elements 6 and 8, which are e.g. circular and whose axes have the spacing L. In the same way, the part 4 carries contact pads or elements 10 and 12, which are e.g. circular and whose axes also have a spacing L and which are intended to be respectively connected to the contact pads 6 and 8. The pads are e.g. metallic, e.g. of gold, a metal which is wettable by a material such as indium in the melted state. However, on each part, the environment of each contact pad is e.g. of silica, which is not wettable by said material in the molten state.

On the contact pads 6 and 8 of part 2 are respectively formed e.g. cylindrical indium wafers 14 and 16 having the same thickness d, in such a way that each wafer covers the pad associated therewith and projects beyond the same so as to also cover a non-wettable portion of the part 2 and which surrounds the pad in question. Therefore the wafers 14 and 16 have respective diameters D1 and D2, in such a way that D1 is more than twice the radius r1 of pad 6 and D2 is more than twice the radius r2 of pad 8.

Moreover, said wafers are such that D1 is more than twice the radius r'1 of stud 10 of the part 4 and that D2 is more than twice the radius radius r'2 of pad 12 of said part 4.

The volumes of the wafers 14 and 16 differ and, as will be shown hereinafter, are determined, together with the parameters L, d, r1, r2, r'1 and r'2, in such a way that when the assembly is made (FIG. 1B), the faces of the parts 2 and 4, which face one another, form between them a predetermined angle a.

Once the wafers have been formed, the part 4 is placed on the part 2 in such a way that the pad 10 comes into contact with the wafer 14 and the pad 12 comes into contact with the wafer 16.

The soldering metal wafers and the contact pads (pads whose respective surfaces are, in the given embodiment, in the same plane as the surfaces of the environment of said studs) are obtained by conventional procedures in microelectronics (irradiation of the photosensitive resin, followed by etching).

Thus, the accuracy of the assembly to be formed is essentially equal to the accuracy obtained with such procedures.

For example, the wafers are formed by firstly depositing a continuous indium layer of thickness d on the surface of the part 2 and then placing above the locations where it is wished to form the wafers, masks which prevent the etching of the layer at these points. This is followed by local chemical etching of the unmasked parts, so as to only leave the wafers 14 and 16, chemical etching being stopped when the surface of the part 2 is reached.

After aligning the two faces of the parts 2 and 4 and therefore the bringing into contact of the contact pads 10 and 12 with the corresponding wafers 14 and 16, the welding metal (indium in the example given) is heated to a temperature equal to or above its melting point.

As a result of the surface tension, the metal, which is then liquid, collects in the form of truncated spherical drops, which carry the references 18 and 20 in FIG. 1B and which are respectively associated with the wafers 14 and 16. It should be noted that each drop is only in contact with the two corresponding contact pads. The truncations of the spherical drops are due to the contact between these liquid metal drops and the wettable surfaces of the contact pads. The distance between these truncations is dependent on the diameter of the corresponding liquid metal drop, as well as the diameters of the facing wettable surfaces. Consequently by varying these parameters, it is possible to vary the distance between the facing wettable surfaces.

Thus, by using two spherical drops of different diameters (resulting from the wafers of different diameters), it is possible to obtain an assembly of two parts forming between them an angle a which is directly linked with the geometrical characteristics of the spherical drops, as can be seen in FIG. 1. Once the assembly is obtained, it is cooled to below the melting point of the soldering metal.

It has been stated that the drops are spherical. Thus, the volumes obtained are slightly deformed spheres. During melting, the liquid metal which tends to assume a spherical shape by surface tension, is exposed to other forces, which can slightly modify its shape.

The process according to the invention is advantageously usable in the case of the installation of small mirrors in restricted or constricted locations, said mirrors being exposable to high accelerations.

Figure 2A:
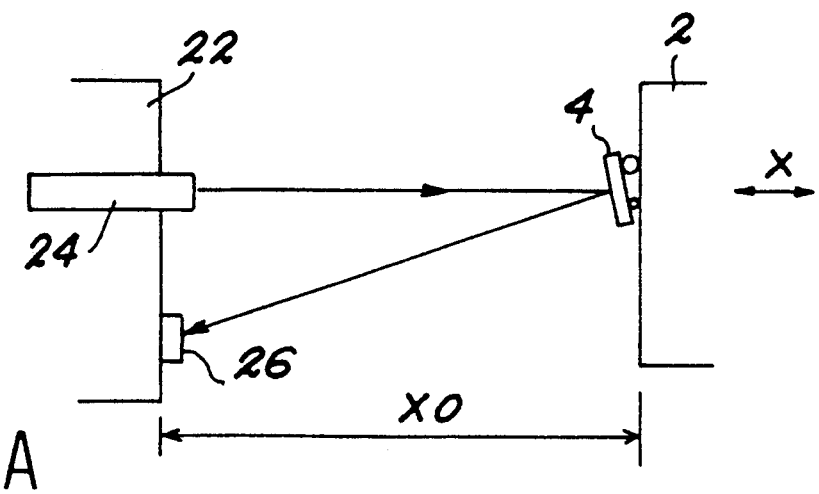
FIGS. 2A to 2C: Diagrammatically an application of the invention to the production of a proximity detector.
Figure 2B:
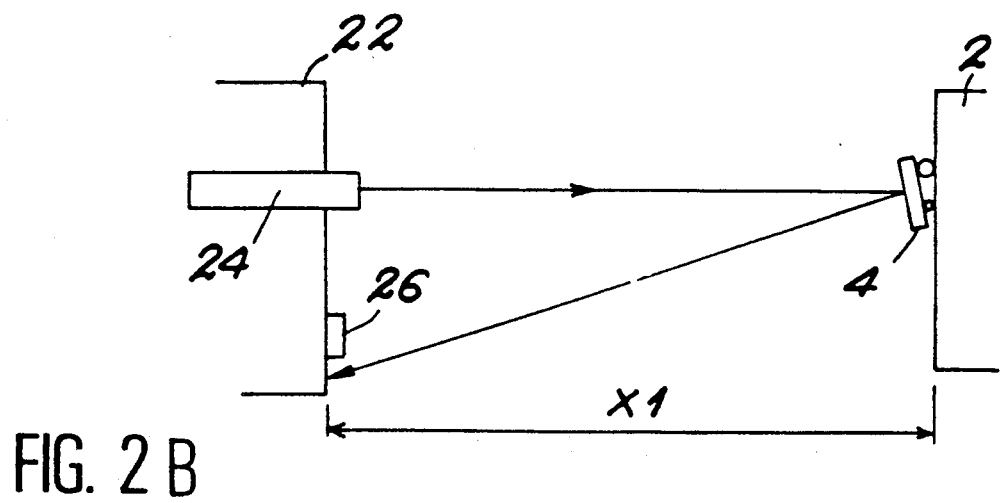
Figure 2C:
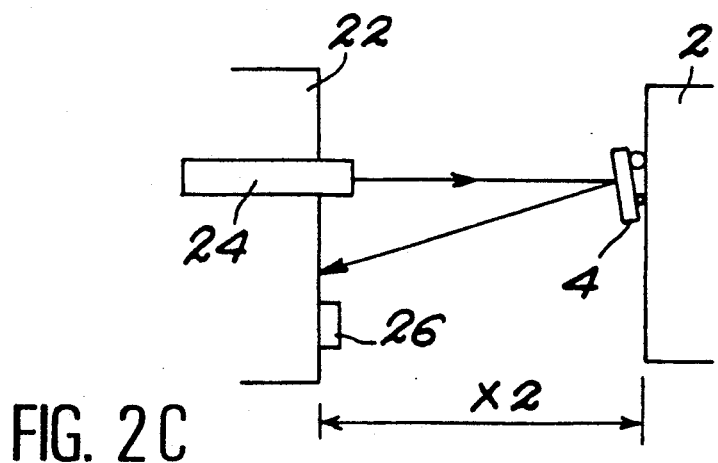

Thus, the invention is e.g. applicable to the construction of a proximity detector, as can be seen in FIGS. 2A to 2C. The part 2 is displaceable in translation parallel to an axis X with respect to a support 22, which carries a punctiform light source 24 able to emit a light beam parallel to the axis X, as well as a photodetector 26 able to supply a signal when it receives a beam of said light.

The part 4 is able to reflect said light by its other face (which does not face the part 2) and is fixed to said part 2 in such a way as to be positioned facing the source 22, so that it receives the beam from said source, the inclination of the part 4 with respect to the part 2 being such that the beam reflected by the part 4 propagates in the direction of the zone of the support 22 in which is located the photodetector 26.

Thus, there is a position of the part 2 with respect to the support 22 for which the photodetector effectively receives the beam reflected by the part 4 and said position corresponds to a distance XO between the part 2 and the support 22 (FIG. 2A).

However, for other positions, when the distance between the part 2 and the support 22 assumes a value $X1 > X0$ (FIG. 2B) or a value $X2 < X0$ (FIG. 2C), the light beam reflected by the part 4 does not reach the photodetector 26.

FIGS. 3A, 3B and 4A, 4B illustrate diagrammatically another important application of the present invention, namely the construction of a mirror, which can be concave, as can be seen in the drawings (but which could also be convex), by the assembly of a large number of second parts $28_1 \ldots 28_m$ (FIGS. 3A and 3B) or $30_1 \ldots 30_n$ (FIGS. 4A and 4B) to a same first part 2, the assembly of the second parts with the first part being carried out in the manner explained relative to FIGS. 1A and 1B. Each of the second parts is a plate, whereof one face not facing the part 2 is optically reflecting.

The other parameters referred to hereinbefore are then determined in such a way that the respective faces of each second part and also the first part, which face one another, form between them a predetermined angle making it possible to obtain the desired concave or convex mirror.

FIGS. 3A, 3B and 4A, 4B do not show the various contact pads, but it is possible to see the wafers associated with the second parts (FIGS. 3A, 4A) and the various soldering elements 18, 20 obtained when the elementary mirrors constituted by the second parts have been formed.

The collective, simultaneous regulation of these elementary mirrors, which is obtained by varying the volume of the metallic connections produced according to the invention, makes it possible to avoid difficult and tiresome working as was required in the prior art, where it was necessary to regulate or adjust the elementary mirrors with respect to one another. Thus, as has been stated, the process according to the invention makes it possible to easily obtain the desired angles between the elementary mirrors and their common substrate (first part 2) by calculating beforehand the volume of each of the connections by soldering elements.

Figure 3A:
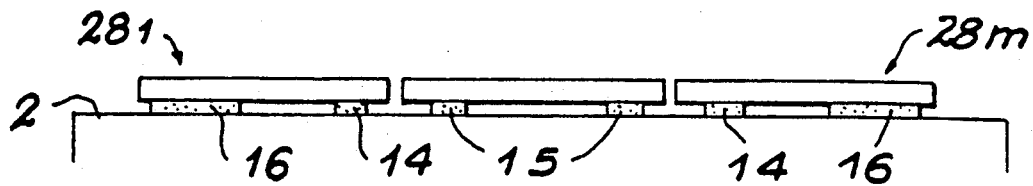
FIGS. 3A, 3B and 4A, 4B: Diagrammatically another application of the invention to the manufacture of mirrors.
Figure 3B:
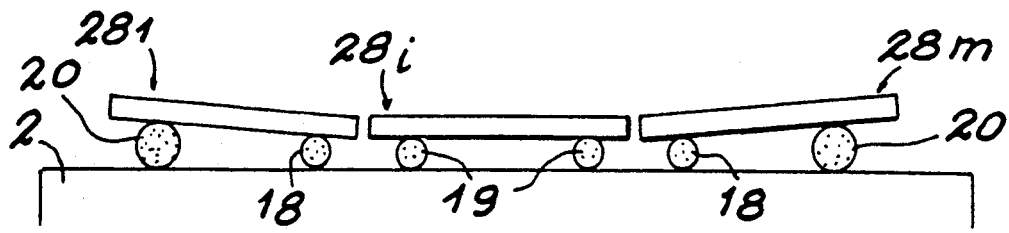
Figure 4A:
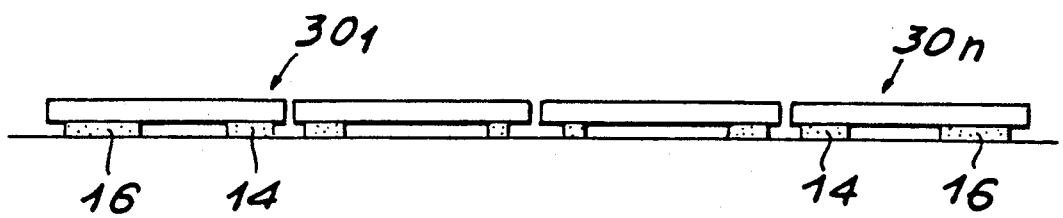
Figure 4B:
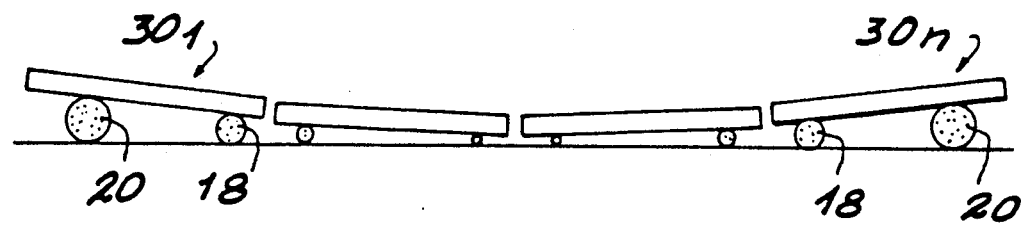

It should be noted that the mirror shown in FIG. 3B has a plane (or an axis) of symmetry, which meets one of the elementary mirrors $28_i$, the latter being associated with two soldering elements 19 of the same volume, unlike the other soldering elements. The soldering elements 19 are produced from two wafers 15 which are also of the same volume (FIG. 3A) and the corresponding elementary mirror $28_i$ thus forms a zero angle with the substrate 2 (which is not the case with the other elementary mirrors).

Figure 5:
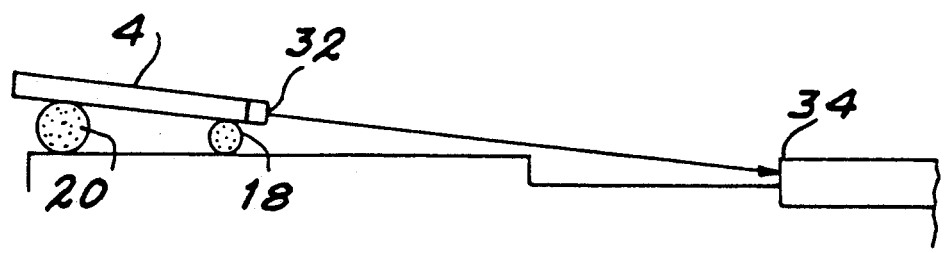
FIG. 5: Diagrammatically another application of the invention to the coupling of a light source to an integrated optical device.

FIG. 5 diagrammatically illustrates another important application of the invention, namely the coupling of a light source such as an emitting diode 32, carried by the second part 4, to an integrated optical device 34 carried by the part 2. The part 4 is then inclined and oriented in such a way that the light beam from the functioning source 32 reaches the integrated optical device 34 and is injected into it.

Moreover, the electric supply of the source 32 can be brought about by means of the soldering elements 18 and 20. To this end, on the parts 2 and 4 which can be semiconductor substrates, are formed appropriate electrical connections permitting the supply of current to the not shown contact pads of the part 2 and the supply of current from the not shown contact pads of the part 4 to the source 32, the connections being produced by microelectronic procedures.

In a purely indicative and non-limitative manner, the process described with reference to FIGS. 1A and 1B applies to the installation of at least one parallelepipedic part 4 with a thickness of approximately 500 μm, a length of approximately 100 μm and a width of approximately 500 μm, the weight of the part 4 being approximately 1 mg and the dimensions of the part 2 supporting the part 4 being decided as a consequence thereof.

In other words, the process described with reference to FIGS. 1A and 1B more particularly applies to the assembly of at least one lightweight, small part to another part. Use need only be made of two soldering elements for obtaining the assembly.

Figure 6A:
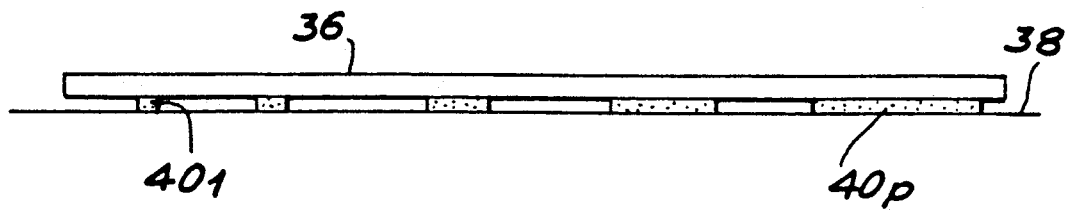
FIGS. 6A and 6B: Diagrammatically a process according to the invention permitting the assembly of parts having a significant length.
Figure 6B:
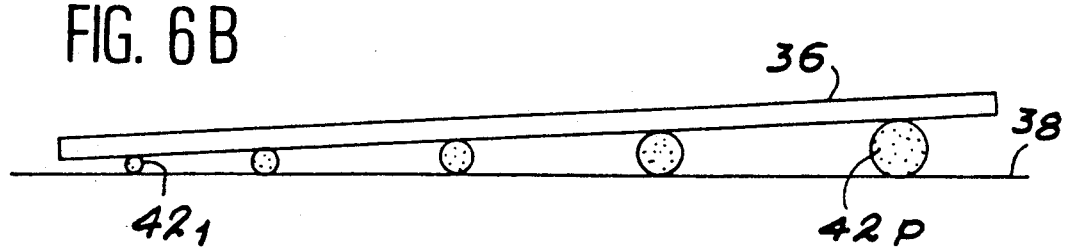

However, when it is wished to assemble a longer, parallelepipedic part 36 (FIG. 6A) with a part 38 of appropriate dimensions, preference is given to the use of a row of several wafers $40_1 \ldots 40_p$, the different aforementioned parameters and among them the volumes of the wafers $40_1$ to $40_p$, being calculated so as to obtain an assembly (FIG. 6B) in which the part 36 forms a predetermined angle with the part 38. The volumes of the soldering elements $42_1 \ldots 42_p$ corresponding respectively to the wafers $40_1 \ldots 40_p$ then increase from one end to the other of the row (the various contact pads not being shown).

Figure 7:
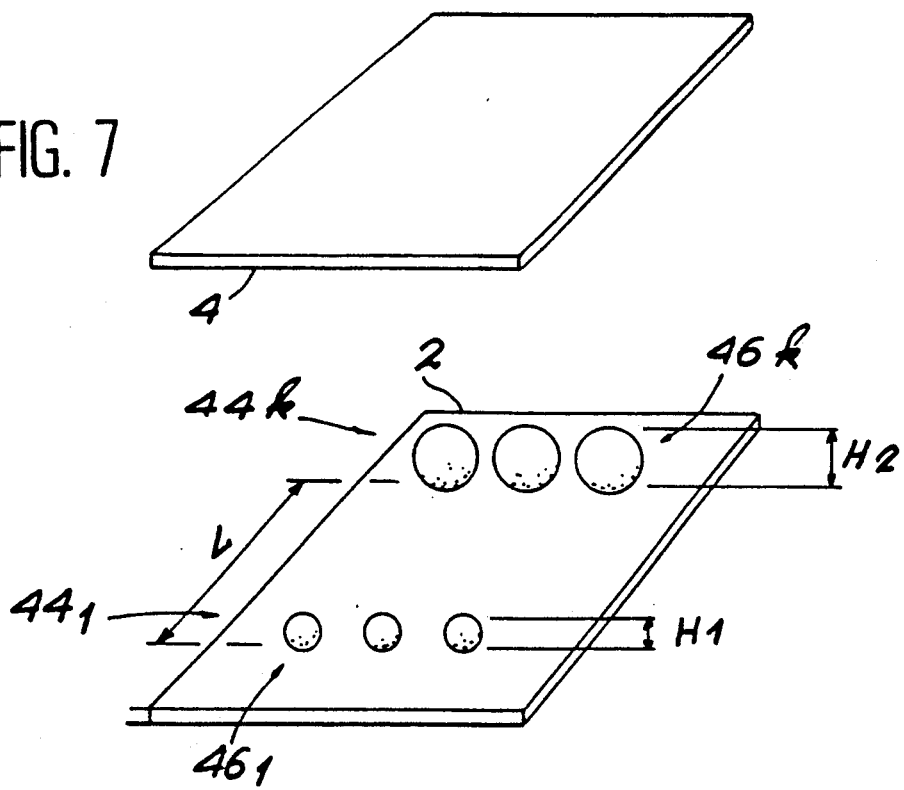
FIG. 7: Diagrammatically a process according to the invention making it possible to assemble parts having a significant width.

In the case of wide parts 2 and 4 (FIG. 7), it may be necessary to use not only a single row of at least two soldering elements, but a plurality of adjacent rows. As can be seen in FIG. 7, where the assembly is shown assuming that parts 4 and 2 have been moved apart, there is a plurality of parallel rows $44_1 \ldots 44_k$, e.g. two rows separated by a distance L, each row $44_1 \ldots 44_k$ having a plurality of soldering elements $46_1 \ldots 46_k$ of the same volume, the volumes increasing from one end row $44_1$ to the other $44_k$ and being determined, as hereinbefore, with the other parameters in order to obtain the desired angle between the two parts 2 and 4.

For reasons of clarity in FIG. 7, the various rows of contact pads of the parts 2 and 4, which are homologous to rows $44_1$ to $44_k$ are not shown and also the various wafers leading to the soldering elements $46_1$ to $46_k$ are not shown.

On returning to FIGS. 1A and 1B an explanation will now be given of the determination of the different parameters making it possible to obtain the predetermined angle a.

On considering in FIG. 1B the dihedron formed by the faces of the parts 2 and 4, which face one another, and the bisecting plane of said dihedron, the axis of the contact pad, which is assumed to be circular, meets this bisecting plane at a point whose distance from the wettable surface of the contact pad 6 is designated H1/2 (half a length designated H1). In the same way, the axis of the contact pad 8, which is also assumed to be circular, meets the bisecting plane at a point whereof the distance from the wettable surface of the contact pad 8 is designated H2/2 (half a length designated H2), so that it is possible to write:

$$H1^3/6 + H1(r'1^2 + r1^2)/2 - d \cdot D1^2 = 0 \quad (1)$$

$$H2^3/6 + H2(r'2^2 + r2^2)/2 - d \cdot D2^2 = 0 \quad (2)$$

Each of the numbers H1 and H2 solves a third degree equation with the following conditions:

$$0 < H1 < (6 \, d \cdot D1^2)^{\frac{1}{3}}$$

$$0 < H2 < (6 \, d \cdot D2^2)^{\frac{1}{3}}$$

In addition, H1 and H2 must be positive and below the respective diameters of the non-truncated spheres corresponding thereto. It is also possible to write:

$$(H2 - H1)/2L = tg(a/2)$$

For example, assuming $r'1 = r1 = 5$ micrometers, $D1 = 20$ micrometers, $d = 6$ micrometers, $r'2 = r2 = 7$ micrometers, $D2 = 30$ micrometers, one obtains $H1 = 22.3$ micrometers and $H2 = 28.8$ micrometers and for $L = 100$ micrometers, the angle a is $3.7°$.

In practice, it is wished to assemble parts of known dimensions with a given angle a. In order to do this, firstly determination takes place of the diameters and the positions of the indium wafers, which are compatible with the dimensions of the parts to be assembled. For example, if the smallest of the two parts has a length 150 micrometers, the distance L between the centres of the wettable surfaces can be 100 micrometers. L must exceed D1+D2. Thus, knowing L, it is possible to determine H2−H1. It is then possible to determine the diameters of the wettable surfaces in such a way that the mechanical attachment of the parts is adequate for holding the same. D1 must exceed 2r1 and 2r'1, D2 must exceed 2r2 and 2r'2 and D1+D2 must be less than the width and length of the parts (in the case where the latter are rectangular).

By choosing d, r1, r2, r'1, r'2 and H1 (which makes it possible to calculate H2), it is possible to determine D1 and D2 by using the formulas (1) and (2).

Then, if the values obtained for D1 and D2 do not satisfy the inequations mentioned, the value of L and possibly that of H1 or other parameters are changed, which makes it possible to calculate other values for D1 and D2 and one continues in this way until all the inequalities relative to the assembly are satisfied in order to obtain the chosen angle a.

We claim:

1. Assembly of a first part and at least one second part wherein the face of the first part faces a face of the second part and forms an angle therewith, and wherein the face of the first part comprises at least two contact pads and the face of the second part comprises contact pads respectively facing those of the first part, the assembly also comprising at least two soldering elements essentially shaped like truncated spheres and connecting the contact pads of the first part to the corresponding contact pads of the second part, one of the soldering elements having a volume larger than that of the other element, the surfaces of the contact pads being wettable by the material of the soldering elements in the molten state, while the areas immediately adjacent said contact pads are not wettable.

2. Assembly according to claim 1, and comprising at least one row of soldering elements whose volumes increase from one end of the row to the other end.

3. Assembly according to claim 1, and comprising a plurality of parallel rows of soldering elements, the soldering elements in each row having the same volume, and increasing in volume from one row to another.

4. Assembly according to claim 1, wherein the first part is displaceable in translation with respect to a support having a light source and a detector mounted thereon, and wherein the second part is adapted to reflect light from its other face, said second part being positioned facing the light source and the detector in such a way that it reflects the light from the light source towards the detector for a given position of the first part with respect to the support.

5. Assembly according to claim 1, and comprising a plurality of second parts each of whose other faces are optically reflecting and which are fixed to the first part by said soldering elements in such a way that the other faces of the second parts form a mirror.

6. Assembly according to claim 1, wherein the first part has an integrated optical device mounted thereon, and the second part has a light emitter mounted thereon for supplying a light beam in the direction of the integrated optical device.

7. Process for the assembly of a first part and at least one second part wherein the face of the first part faces a face of the second part and forms an angle therein, the face of the first part carrying contact pads for connection respectively to contact pads carried on the face of the second part by means of soldering elements made from a metallic material having a relatively low melting point, the surface of each contact pad being wettable by the material in the molten state, whereas areas immediately surrounding said pads are not wettable, comprising the steps of covering each contact pad of the first part with a wafer of said soldering material, placing the contact studs of the second part on the corresponding wafers of the first part, heating the wafers to a temperature at which they are in the molten state, whereupon said wafers form truncated spheres joining said contact pads, and cooling said resulting truncated spheres to below the molten state, said wafers all having substantially identical thickness, and at least some having different volumes which are chosen such that the face of the second part forms a predetermined angle with the face of the first part.

8. Process according to claim 7, wherein the first part comprises at least one row of contact pads, and the wafers covering said pads have volumes which increase from one end of the row to the other.

9. Process according to claim 7, wherein the first part comprises a plurality of parallel rows of contact pads, each pad within a row being each covered by wafers of the same volume, and the volumes of the wafers increasing from one row to another.

* * * * *